(12) United States Patent
Chen et al.

(10) Patent No.: US 8,278,145 B2
(45) Date of Patent: Oct. 2, 2012

(54) METHOD FOR PACKAGING SEMICONDUCTOR DEVICE

(75) Inventors: Chien-Wen Chen, New Taipei (TW);
Longqiang Zu, Palo Alto, CA (US);
Chen-Fa Tsai, Kaohsiung (TW)

(73) Assignee: Global Unichip Corporation, Hsinchu (TW)

( * ) Notice: Subject to any disclaimer, the term of this patent is extended or adjusted under 35 U.S.C. 154(b) by 0 days.

(21) Appl. No.: 13/064,646

(22) Filed: Apr. 6, 2011

(65) Prior Publication Data

US 2012/0021564 A1 Jan. 26, 2012

(30) Foreign Application Priority Data

Jul. 23, 2010 (TW) ................................ 99124266 A

(51) Int. Cl.
*H01L 21/44* (2006.01)

(52) U.S. Cl. ................. 438/108; 257/E21.505

(58) Field of Classification Search ................. 438/108; 257/E21.505
See application file for complete search history.

(56) References Cited

U.S. PATENT DOCUMENTS

| 7,501,310 | B2* | 3/2009 | Yang et al. ............... 438/106 |
| 2008/0123305 | A1* | 5/2008 | Amidi et al. .............. 361/737 |
| 2010/0049344 | A1* | 2/2010 | Capio ....................... 700/94 |
| 2011/0140260 | A1* | 6/2011 | Bonthron et al. ......... 257/690 |
| 2011/0278718 | A1* | 11/2011 | Thacker et al. ........... 257/737 |
| 2011/0298137 | A1* | 12/2011 | Pagaila et al. ............ 257/773 |
| 2011/0316156 | A1* | 12/2011 | Pagaila et al. ............ 257/738 |

* cited by examiner

*Primary Examiner* — Alexander Ghyka
*Assistant Examiner* — Stanetta Isaac
(74) *Attorney, Agent, or Firm* — Bacon & Thomas, PLLC

(57) ABSTRACT

The present invention provides a method for packaging semiconductor device which is using more than once reflow processes to heat the solder ball to prevent the deformation of solder ball, so that the yield of the manufacturing process can be increased and the reliability of the semiconductor device can be increased.

17 Claims, 3 Drawing Sheets

METHOD FOR PACKAGING SEMICONDUCTOR DEVICE

BACKGROUND OF THE INVENTION

1. Field of the Invention

The present invention related to a system in package, and more particularly to more than once reflow processes is performed to prevent the circuit short from the deformation of the conductive elements before the package structure is accomplished.

2. Description of the Prior Art

Miniaturized semiconductor dice has been a trend for its various functions. These semiconductor dices should be provided with more and more I/O pads within a smaller region, thus the density of metal pins will raises as well. Therefore, the early package technology of lead frame is not suitable for the high density metal pins, also has been replaced by the technology of ball grid array (BGA). It is advantageous for BGA to provide more compact density and to have the solder balls, less subject to damage and distorted.

With 3C products in fashion, such as cell phone, PDA or iPod, these 3C products are equipped with at least one systemic die within a smaller volume. A wafer level package (WLP) has been developed to packaging a wafer before sawing. U.S. Pat. No. 5,323,051 discloses one kind of wafer level package. However, for WLP, the increasing number and the reduced pitches of the bonding pads result in signal coupling and noise. In addition, the reliability of package may be reduced because of the reduced pitches. Thus, WLP aforementioned may not satisfy the design of smaller dices.

In addition, assembling several ICs required by a system in a single package is now a common practice for complex electronic systems, and is often referred to as a SIP (System in Package). Using a SIP assembly will result in the improved performance, less cost, and reduced size or dimension for an electronic system. Early SIP technology was based on wire bond structure or dies. However, as the number of different ICs in an electronic system increased or became more complex, the large number of wire bonds is almost unmanageable, and, making hundreds of closely spaced wire bond connections is very difficult. Furthermore, such complex wire bond arrangements are prone to breaks and/or shorts between wire bonds.

Therefore, in order to solve the problem which is introduced by wire bonding process, the present invention provide a die that is formed on substrate by using the flip-chip technology, and more than once reflow process is performed to ensure the connection between the die and the substrate, so as to maintain the integrity of the semiconductor device.

SUMMARY OF THE INVENTION

According to above problems, the primary objective of the present invention is that more than once reflow process is performed to prevent the deformation of solder ball to increase the yield of the manufacturing process, so as to the reliability of the package structure can be increased.

Another primary objective of the present invention is to provide a method for packaging system in package, the optimized material weight parameter of the center line material layer is determined to find out during the wafer mounting process.

According to above objectives, the present invention provides a method for packaging semiconductor device, which includes providing a die having an active surface and a back surface, and a plurality of dies wafer on the active surface; providing a substrate having a top surface and a back surface, a plurality of first connecting points on the top surface and a plurality of second connecting points on the back surface corresponds to the plurality of first connecting points, and the plurality of first connecting points is electrically connected the plurality of second connecting points; attaching the plurality of dies on the top surface of the substrate, the active surface of the plurality of dies is inversed toward the top surface of the substrate, and the plurality of pads on the plurality of dies is electrically connected the plurality of first connecting points on the substrate; filling a under fill material to encapsulate the active surface of the plurality of dies and the portion of top surface of the substrate to form a package body; forming a center line material layer on the top surface which is not covered by the package body on the substrate; providing at least one memory component having an active surface and a plurality of pads on the active surface of the memory component; attaching the memory component on the top surface of the center line material layer, the active surface of the memory component is inversed toward the top surface of the center line material layer, and the plurality of pads on the memory component is electrically connected the plurality of first connecting points; mounting a top lid on the back surface of the plurality of dies and on the back surface of the memory component; forming a plurality of conductive elements on the back surface of the substrate and is electrically connected the plurality of second connecting points; and performing more than once reflow processes to fix the plurality of conductive elements on the plurality of second connecting points.

DESCRIPTION OF THE PREFERRED EMBODIMENT

The present invention will now be described more fully hereinafter with reference to the accompanying drawings, in which preferred embodiments are shown. The objective of the present invention is to provide a method for packaging semiconductor device. In the following, the well-known knowledge regarding the of the invention such as the formation of die and the process for forming package structure would not be described in detail to prevent from arising unnecessary interpretations. However, this invention will be embodied in many different forms and should not be construed as limited to the embodiments set forth herein.

In the modern semiconductor package process, the wafer is doing the thinning process after the front end process to thin the size of the die between 2 mils to 20 mils. The coating or the printing process is used to coat or print the polymer on the bottom of the die. The polymer is made by the resin or the B-Stage resin. The baking or the photo-lighting process is used to let the polymer be a semi-glue material. Then a removable tape is used to stick on the polymer and the wafer sawing process is used to saw the semiconductor wafer into several dies.

Figure 1A:
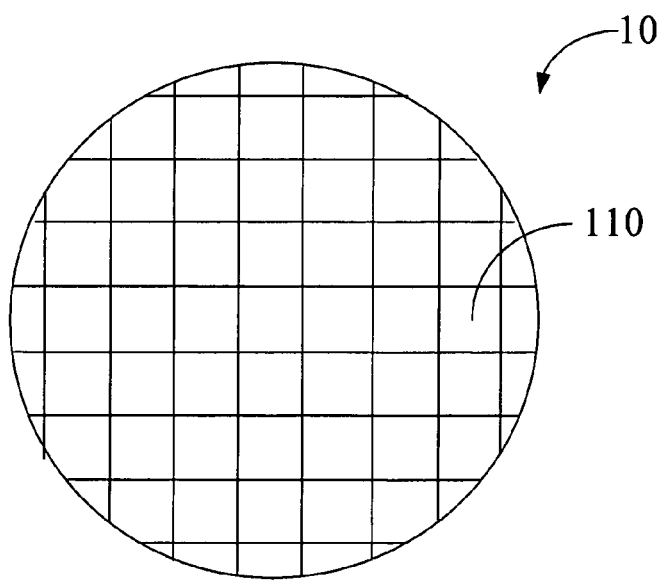
FIG. 1A shows wafer that is provided with a plurality of dies thereon according to the present invention disclosed herein.
Figure 1B:
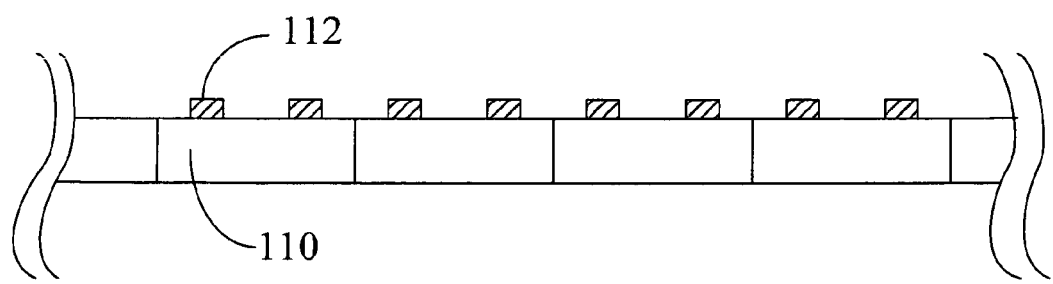
FIG. 1B shows a cross-sectional view of the wafer that is sawed to obtain a plurality of dies according to the present invention disclosed herein.

Referring to FIG. 1A, a wafer 10 is provided with a top surface (not shown) and a back surface, and a plurality of dies 110 is arranged on the wafer 10. Then, the wafer 10 is sawed to obtain a plurality of dies 110, and a plurality of pads 112 on the active surface (not shown) of each plurality of dies 110 as shown in FIG. 1B.

Figure 2:
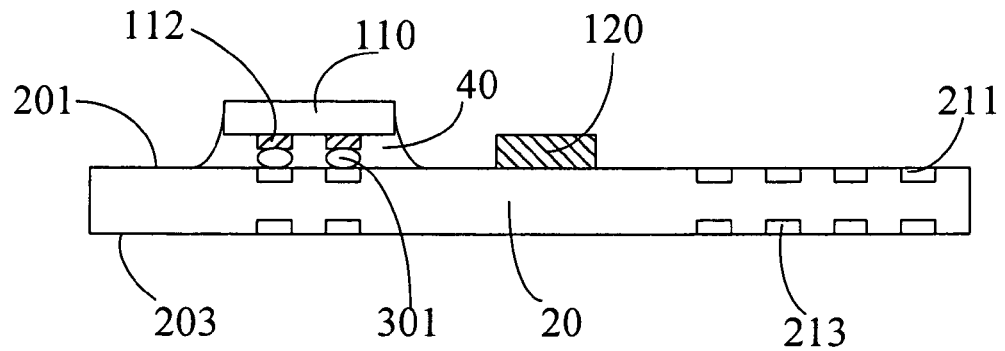
FIG. 2 shows a cross-sectional view of the die that is formed on the substrate by using the flip-chip technology according to the present invention disclosed herein.

Please referring to FIG. 2, a substrate 20 includes a top surface 201 and a back surface 203, and a plurality of first connecting points 211 (conductive connecting points) having a plurality pattern is disposed on the top surface 201, a plurality of second connecting points (metal connecting points) 213 corresponds to the plurality of first connecting points 211 is disposed on the back surface 203 of the substrate 20, and the plurality of first connecting points 211 is electrically connected to the plurality of second connecting points 213 (i.e. a plurality of metal points 213). Herein, the substrate 20 can be the printed circuit board (PCB). It should be noted that the formation of the plurality of first connecting points 211 on the top surface 201 and the plurality of second connecting points 213 on the back surface 203 is the same as the conventional prior art, and thus, it is not to be described in detail herein.

Then, also referring to FIG. 2, the active surface (not shown) of at least one die 110 is inversed toward the top surface 201 of the substrate 20 by using the flip-chip technology, and the plurality of pads 112 on the active surface of die 110 is electrically connected on the plurality of first connecting points 211 on the top surface 201 of the substrate 20. In the embodiment, a plurality of connecting elements 301 is disposed between the plurality of pads 112 of the die 110 and the substrate 20 to fix the die 110 on the substrate 20. Herein, the connecting element 301 can be metal bump or conductive glue. Next, a polymer material is filled to encapsulate the four sides of the die 110 and between the active surface of the die 110 and the top surface 201 of the substrate 20 to form a package body 40 by using the under filling technology, and a back surface of the die 110 is to be exposed. Herein, the polymer material is the epoxy resin. In the embodiment, the die 110 can be a control component, logical component, or passive component. In addition, a capacitor 120 is further disposed adjacent the die 110, and is electrically connected the top surface 201 of the substrate 20.

Figure 3:
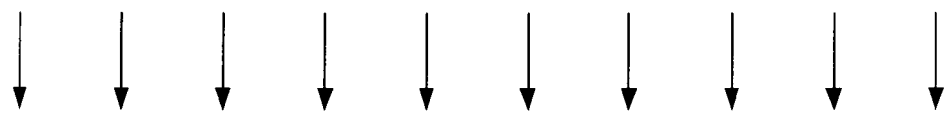
FIG. 3 shows a cross-sectional view of the memory component that is formed on the substrate by using the flip-chip technology according to the present invention disclosed herein.
Figure 3:
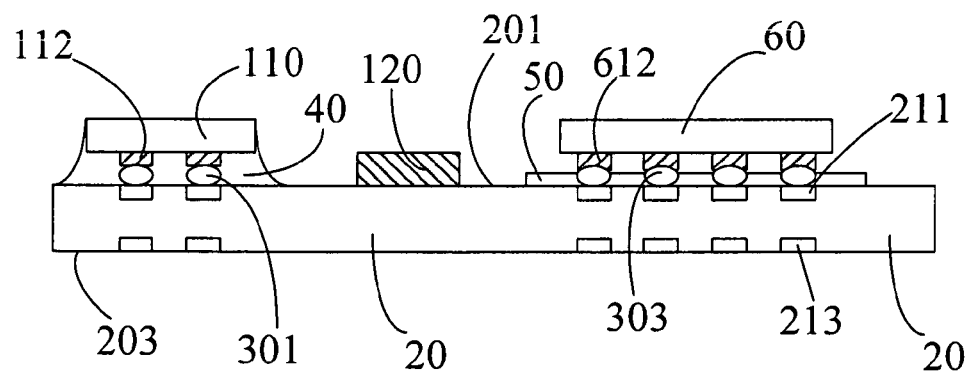

Next, referring to FIG. 3, a center line material layer 50 is formed on the top surface 201 of the substrate 20 which is not covered by the package body 40. The material for the center line material layer 50 can be copper or resin. Then, a second die 60 such as memory component is provided with an active surface (not shown) thereon, and a plurality of pads 612 is disposed on the active surface of the memory component 60. Similarly, the active surface of the memory component 60 is inversed toward the top surface 201 of the center line material 50 by using the flip-chip technology, and is disposed on the top surface 201 of the center line material layer 50 adjacent to the capacitor 120. In the embodiment, a plurality of connecting elements 303 is further disposed between the plurality of pads 612 on the memory component 60 and the substrate 20, and the plurality of pads 612 on the active surface of the memory component 60 is electrically connected the plurality of first connecting points 211 on the top surface 201 of the substrate 20. In the embodiment, the memory component 60 can be the reduced latency dynamic random access memory (RLDRAM) or the fast cycle random access memory (FCRAM). In addition, the connecting element 303 can be the solder ball, metal bump, or conductive glue.

Please also referring to FIG. 3, the heat process (not shown), for example, reflow process, is performed to cure the center line material layer 50 to fix the memory component 60 on the top surface 201 of the substrate 20. It should be noted that the purpose for the center line material layer 50 between the substrate 20 and the memory component 60 is used to prevent breakdown of the memory component 60 or to prevent the deformation of the plurality of connecting elements 303 between the memory component 60 and the substrate 20 during the reflow process is carried out on the substrate 20, so that the reliability of the above semiconductor device can be maintained.

After the reflow process is accomplished, the internal visual inspection is performed to determine whether the deformation of the plurality of connecting elements 303 between the substrate 20 and the memory component 60 is generated or not, so that the reliability of the electronic component can be reduced, and to determine whether the center line material layer 50 is excess or not to introduce the deformation of the plurality of connecting elements 303 on the active surface of memory component 60. In addition, the excess of the center line material layer 50 would be introduced the bridging fault at the assembly site (not shown) to reduce the reliability of the semiconductor device. Thus, when the above drawbacks is found during the internal visual inspection process, the process should be stopped to remove the memory component 60 from the substrate 20, and the re-work process is performed to improve the reliability of the semiconductor device and to increase the yield of the final electronic product.

Figure 4:
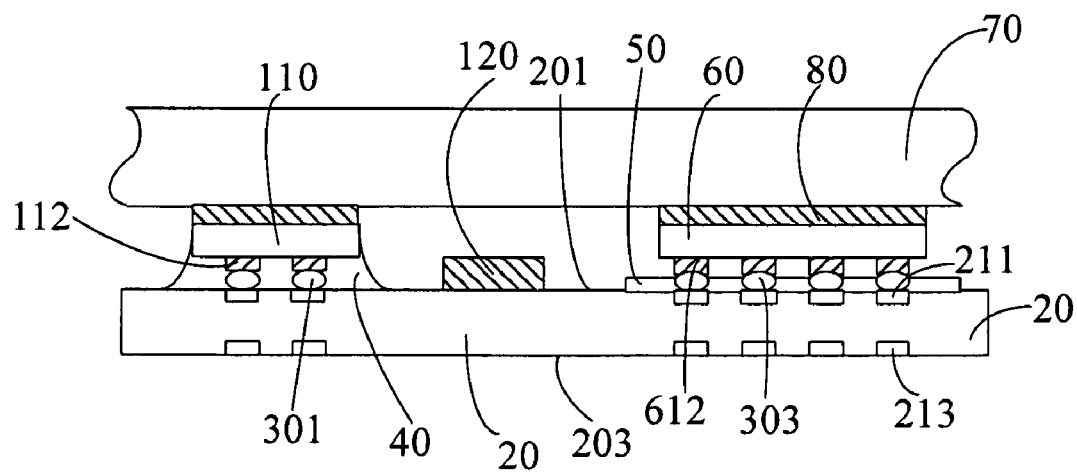
FIG. 4 shows a cross-sectional view of the top lid that is mounted on the top of the structure of FIG. 3 according to the present invention disclosed herein.

Then, please referring to FIG. 4, a top lid 70 is mounted on the top of the package structure of the FIG. 3 after the internal visual inspection is finished. An adhesive layer 80 is further formed on the back surface of the die 110 and on the back surface of the memory component 60 to fasten the package structure of the FIG. 4 together. In another embodiment of the present invention, the alignment mark (not shown) with cross shaped is formed on the back surface of the die 110 and on the back surface of the memory component 60 on the x-y direction by the photo-etching process or the laser mark process. Then, the top lid 70 is aligned the alignment mark to mount on the back surface of the die 110 and on the back surface of the memory component 60. Herein, it should be noted that the alignment mark process can be performed after the internal visual inspection process or be formed on the back surface of a plurality of dies 110 on the wafer (not shown) before the wafer is sawed.

Figure 5:
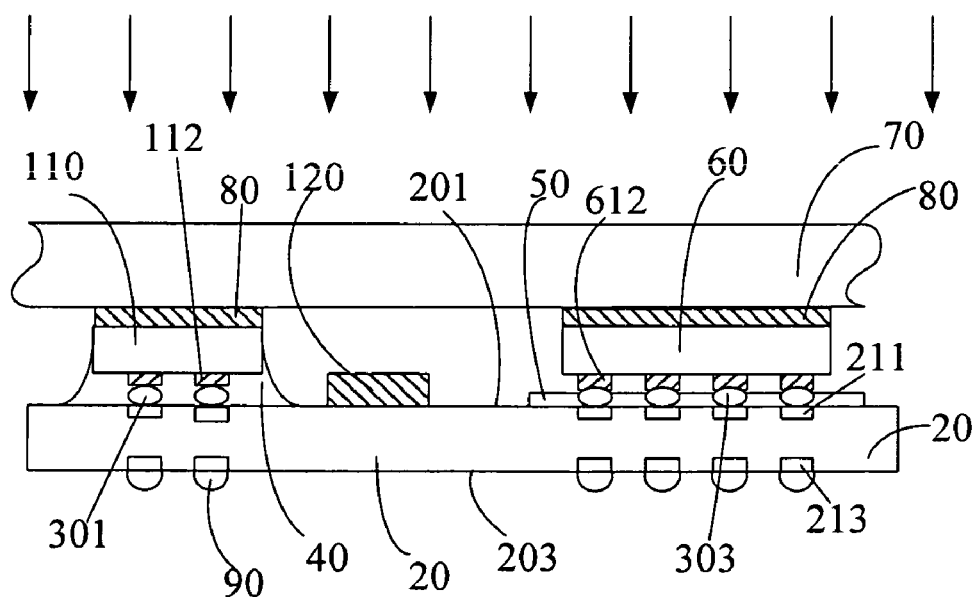
FIG. 5 shows a cross-sectional view of the plurality of conductive elements formed on the back surface of the substrate to accomplish the semiconductor device according to the present invention disclosed herein.

Next, please referring to FIG. 5, a plurality of conductive elements 90 is formed on the back surface 203 of the substrate 20, and is used to electrically connect with the exterior electronic device (not shown) to form a module package structure, and the connecting element 90 is solder ball. Next, the heat process such as reflow process, is performed to heat the substrate 20 of the module package structure, such that the brittleness of the conductive element 90 is to be reduced, the toughness and plasticity is to be increased, the quench stress can also be reduced or eliminated, and the shape and size of the material of the conductive element 90 can be constant to prevent the deformation and/or the breakdown are generated.

Therefore, according to aforementioned discussion, the more than once reflow processes can be performed repeatedly to ensure the deformation of the connecting element 303 between the substrate 20 and the memory component 60 is not to be generated, and the good electrical connection between the substrate 20 and the memory component 60 can also be carried out to ensure the hardness of the conductive element 90. Herein, the temperature for the reflow process is about 200° C. to 250° C. Finally, the final inspection is performed to detect the package structure to accomplish the package process for the semiconductor device.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for packaging a semiconductor device, comprising:
   providing a wafer having an top surface and a back surface, and a plurality of dies on said wafer;
   sawing the wafer to obtain a plurality of dies having an active surface, said active surface having a plurality of pads;
   providing a substrate having a top surface and a back surface, a plurality of first connecting points on said top surface, and a plurality of second connecting points on said back surface corresponds to said plurality of first connecting points, and said plurality of first connecting points being electrically connected said plurality of second connecting points;
   attaching said plurality of dies on said top surface of said substrate, said active surface of said plurality of dies being inversed toward said top surface of said substrate by using a flip-chip technology, and said plurality of pads being electrically connected said plurality of first connecting points;
   filling a under fill molding material to encapsulate said active surface of said plurality of dies and portion of said top surface of said substrate to form an package body;
   forming a center line material layer directly connected said top surface being not covered by said package body on said substrate;
   providing at least one memory component having an active surface and a back surface, and a plurality of pads on said active surface of said memory component;
   attaching said memory component on said top surface of said center line material layer on said substrate, said active surface of said memory component being inversed toward said top surface of said center line material layer, and said plurality of pads being electrically connected said plurality of first connecting points;
   mounting a top lid on said back surface of said memory component and on said back surface of said plurality of dies;
   forming a plurality of conductive elements on said back surface of said substrate and being electrically connected said plurality of second connecting points; and
   performing more than once IR reflow method to fix said plurality of connecting elements on said plurality of second connecting points.

2. The method according to claim 1, further comprising a capacitor being disposed between said plurality of dies and said memory component on said substrate.

3. The method according to claim 1, wherein the material of said center line material layer is made of copper or resin.

4. The method according to claim 1, wherein said die is selected from the group consisting of passive component, logical component, and control component.

5. The method according to claim 1, wherein said memory component comprises reduced latency dynamic random access memory (RLDRAM).

6. The method according to claim 1, wherein said memory component is fast cycle random access memory (FCRAM).

7. The method according to claim 1, further comprising an adhesive layer being disposed between said top lid and said plurality of dies and said memory component, so that said top lid being fixed on said back surface of said plurality of dies and on said back surface of said memory device via said adhesive layer.

8. The method according to claim 1, wherein the temperature for said IR reflow method is between 200° C. to 250° C.

9. A method for packaging a semiconductor device, comprising:
   providing a first die having an active surface and a plurality of pads on said active surface;
   providing a substrate having a top surface and a back surface, a plurality of first connecting points on said top surface, and a plurality of second connecting points on said back surface corresponds to said plurality of first connecting points, and said plurality of first connecting points is electrically connected said plurality of second connecting points;
   attaching said first die on said top surface of said substrate, said active surface of said first die being inversed toward said top surface of said substrate, and a plurality of pads of plurality of first dies being electrically connecting said plurality of first connecting points;
   filling an under fill molding material to encapsulate said active surface of said first die and on portion of said top surface of said substrate to form a package body;
   forming a center line material layer directly connected said top surface being not covered by said package body on said substrate;
   providing a second die having an active surface and a back surface, a plurality of pads on said active surface;
   attaching said second die on said top surface of said center line material layer on said substrate, said active surface of said second die being inversed toward said top surface of said center line material layer by using a flip-chip technology, and said plurality of pads on said active surface of said second die being electrically connected portion of said plurality of conductive connecting points;
   mounting a top lid on said back surface of said first die and on said back surface of said second die;
   forming a plurality of conductive elements on said back surface of said substrate and being electrically connected said plurality of connecting points; and
   performing more than once IR reflow process to fix said plurality of connecting elements on said plurality of second connecting points tightly.

10. The method according to claim 9, further comprising a capacitor being disposed between said first die and said second die on said substrate.

11. The method according to claim 9, wherein the material of said center line material layer is made of copper or resin.

12. The method according to claim 9, wherein the function and dimension are different between said first die and said second die.

13. The method according to claim 9, wherein said first die is selected from the group consisting of passive component, logical component, and control component.

14. The method according to claim 9, wherein said second die comprises reduced latency dynamic random access memory (RLDRAM).

15. The method according to claim 9, wherein said second die comprises fast cycle random access memory (FCRAM).

16. The method according to claim 9, further comprising an adhesive layer is disposed between said top lid and said first die and second die, so that said top lid is fixed on said back surface of said first die and on said back surface of said second die via said adhesive layer.

17. The method according to claim 9, wherein the temperature for said IR reflow method is between 200° C. and 250° C.

* * * * *